(12) United States Patent
Lewicki

(10) Patent No.: US 6,351,506 B1
(45) Date of Patent: Feb. 26, 2002

(54) SWITCHED CAPACITOR FILTER CIRCUIT HAVING REDUCED OFFSETS AND PROVIDING OFFSET COMPENSATION WHEN USED IN A CLOSED FEEDBACK LOOP

(75) Inventor: Laurence Douglas Lewicki, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/294,289

(22) Filed: Apr. 19, 1999

(51) Int. Cl.[7] .................................................. H04B 1/10
(52) U.S. Cl. ........................ 375/350; 341/172; 327/337; 327/554
(58) Field of Search ................................ 375/229, 350; 341/118, 120, 126, 143, 155, 172; 327/337, 554; 333/173

(56) References Cited

U.S. PATENT DOCUMENTS

| | | | | |
|---|---|---|---|---|
| 4,989,219 A | * | 1/1991 | Gerdes et al. | 375/286 |
| 5,477,481 A | | 12/1995 | Kerth | 364/825 |
| 5,995,534 A | * | 11/1999 | Fullerton et al. | 375/130 |
| 6,271,782 B1 | * | 8/2001 | Steensgaard-Madsen | 341/143 |

OTHER PUBLICATIONS

IEEE International Solid–State Circuits Conference, Session 20/RF/Baseband Processing/Paper FP 20.3, "Analog Baseband Processor for CDMA/FM Portable Cellular Telephones", Feb. 17, 1995, pp. 328–329.

Hsieh, Kuo–Chiang et al., "A Low–Noise Chopper–Stabilized Differential Switched–Capacitor Filtering Technique", pp. 243–250.

* cited by examiner

*Primary Examiner*—Don N. Vo
(74) *Attorney, Agent, or Firm*—Wildman, Harrold, Allen & Dixon; Mark Dalla Valle

(57) ABSTRACT

A switched capacitor filter circuit having reduced offsets and providing offset compensation when used in a closed feedback loop includes a chopper stabilized amplified filter circuit which amplifies and low pass filters its input data signal to produce an output signal with an out of band signal frequency component which is at the chop signal frequency and represents an offset and 1/f noise of the chopper stabilized amplified filter circuit. An output switched capacitor filter circuit which is synchronized with the chopper stabilized amplified filter circuit filters this signal with a stopband filter frequency response that virtually eliminates such out of band signal frequency component. When used in a closed feedback loop, this filtered signal is used to generate an offset compensation signal that corresponds to the residual offset within the output signal resulting from the amplifying and filtering of the input data signal. This offset compensation signal is then added to the input data signal prior to its amplification and filtering by the chopper stabilized amplified filter circuit.

20 Claims, 6 Drawing Sheets

US 6,351,506 B1

SWITCHED CAPACITOR FILTER CIRCUIT HAVING REDUCED OFFSETS AND PROVIDING OFFSET COMPENSATION WHEN USED IN A CLOSED FEEDBACK LOOP

BACKGROUND OF THE INVENTION

1. Field of the Invention

The present invention relates to switched capacitor filter circuits, and in particular, switched capacitor filter circuits having reduced offsets and providing offset compensation when used in closed feedback loops.

2. Description of the Related Art

Cellular telephones typically operate in a standby mode in which most active receiver circuitry is powered up, or enabled, only long enough to detect the presence of an incoming call. This so-called "power-up" time is typically in the range of 20 percent. Added to this 20 percent "power-up" time is the overhead time needed to initialize the system, e.g., the time needed to achieve phase lock within the phase lock loops of the system and to compensate for receiver circuit offsets. Hence, if the overhead time is 5 percent, then the average power dissipation during standby mode has increased by 25 percent (0.25/0.2=1.25). Accordingly, it follows that if the overhead time can be reduced then the average power dissipation during standby operation can also be reduced. For example, one conventional CDMA (code division multiple access) spread spectrum cellular system has a typical overhead time of approximately four milliseconds (ms), and it has been a goal to reduce such overhead time by a factor of four to approximately 1 ms.

Referring to FIG. 1, cellular telephones, as with most communication systems, require high gain baseband filters within the receive signal path. In such applications, the in-band signal is amplified and conveyed to subsequent stages for processing, e.g., to an analog-to-digital converter (ADC). This analog filtering serves two purposes: reducing the magnitude of interfering signals outside the band of interest; and providing anti-aliasing. With respect to the former purpose, reducing the magnitude of interfering signals outside of the band of interest prevents large out-of-band signals from reducing the dynamic range of the system. However, it is important that the power dissipated within the filter be less than the power that would be required for an ADC with sufficient resolution to handle such out-of-band interference. For example, if the out-of-band interference is 40 decibels (dB) higher than the in-band signals, the resolution of the ADC, without such filtering, would increase from four bits to 11 bits.

Referring to FIG. 2, and with respect to the latter purpose, providing anti-aliasing is achieved by causing the frequency selectivity of the filter to reduce the magnitude of signals beyond the Nyquist rate of the ADC to prevent such signals from "aliasing" back into the passband as a result of the sampling process and thereby further reducing the dynamic range.

The DC offsets in the receive signal path cause performance of the system to degrade in at least two ways. Offsets near the front end of the system get amplified by the active filter circuit and thereby reduce the available dynamic range of the ADC at the output. Additionally, referring to FIG. 3, offsets create errors in the two receiver signal paths commonly referred to as "in-phase" (I) and "quadrature" (Q) signal paths, thereby creating constellation distortion. The magnitude of the error E equals the difference between the ideal I and Q signal vectors. These errors decrease the available signal-to-noise (SNR) ratio, thereby further reducing the system performance. For example, in one conventional type of cellular telephone, the receiver input data is encoded using quadrature phase shift keying (QPSK). The offsets create an error vector e which causes the constellation points to shift. (The ideal constellation vectors are identified by dashed lines, while the actual resultant constellation vectors are identified with bold lines.) The magnitude of the error vector is computed according to Equation (1).

$$|E| = \sqrt{\sqrt{VOS_I^2 + VOS_Q^2}} \cong 2 \cdot \sqrt{VOS_{MAX}} \tag{1}$$

In one typical cellular telephone receiver, the four-bit ADC within the received signal path operates with a nominal peak-to-peak signal range of 12 digital counts. A maximum offset of one LSB (least significant bit) results in an error vector of 17 percent. Accordingly, in order to reduce this error to 10 percent, it is necessary that the offset be kept to less than one LSB.

Referring to FIG. 4, offset within the quadrature signal paths has been removed in conventional systems by using a low frequency feedback loop to cancel such offset component. In a conventional CDMA spread spectrum cellular telephone system, for example, the baseband information bandwidth extends from one to 630 kilohertz (kHz). So as to not attenuate the low frequency baseband information, the offset cancellation loop bandwidth must be kept well below 1 kHz. So as to maintain signal integrity, low frequency phase response and group delay matching between the I and Q channels is just as important as magnitude matching. The offset cancellation loop bandwidth is typically set to approximately 100 hertz (Hz) to satisfy such requirements.

This conventional design provides offset compensation feedback by way of a pulse density modulated (PDM) output signal generated by a modulator/demodulator (MODEM) chip. This digital signal is filtered by a first order resistive-capacitive (RC) network. The output of this filter is fed into the analog receive filter with a nominal gain of −50% full scale for every +1 volt change in the control voltage. In the worst of cases, the offset values for the transconductive-capacitive (gm-C) filters used in conventional systems are approximately 50% of full scale, e.g., eight counts of a four-bit ADC. As a result of this large potential initial offset error, these loops can take up to 4 ms to converge within 0.5 LSB (2.5 time constants of a 100 Hz filter).

SUMMARY OF THE INVENTION

A circuit containing an embodiment of the present invention provides an offset compensation technique for high gain switched capacitor filters, such as those providing a voltage gain of at least 30 dB, thereby reducing bit error rates caused by such offsets in digital communication systems. Chopper stabilization is used in the amplifier within the filter to reduce offsets. The signal, or tone, at the chopper signal frequency is filtered out with a switched capacitor filter having a cosine filter response. Such a combination of chopper stabilization and switched capacitor cosine filtering virtually eliminates offsets without creating extraneous frequency components in the output of the high gain filter circuit.

In accordance with one embodiment of the present invention, a switched capacitor filter circuit having reduced offsets and providing offset compensation when used in a closed feedback loop includes a signal combining circuit, a chopper stabilized amplified filter circuit, an output filter circuit and an analog-to-digital conversion (ADC) circuit. The signal combining circuit is configured to receive and combine an input data signal and an offset compensation signal and in accordance therewith provide a compensated data signal. The chopper stabilized amplified filter circuit is coupled to the signal combining circuit and is configured to receive one or more chop control signals and in accordance therewith receive and low pass filter the compensated data signal and in accordance therewith provide a low pass filtered signal with an out of band signal frequency component which is at a frequency of the one or more chop control signals and represents an offset and 1/f noise of the chopper stabilized amplified filter circuit. The output filter circuit is coupled to the chopper stabilized amplified filter circuit and is configured to receive and filter the low pass filtered signal and in accordance therewith provide a filtered output data signal in which the out of band signal frequency component is substantially reduced in magnitude. The ADC circuit is coupled to the output filter circuit and is configured to receive and convert the filtered output data signal and in accordance therewith provide a digital output signal. The offset compensation signal corresponds to a residual offset within the digital output signal resulting from the providing of the low pass filtered signal and the filtered output data signal by the chopper stabilized amplified filter circuit and the output filter circuit, respectively.

These and other features and advantages of the present invention will be understood upon consideration of the following detailed description of the invention and the accompanying drawings.

DETAILED DESCRIPTION OF THE INVENTION

Figure 5:
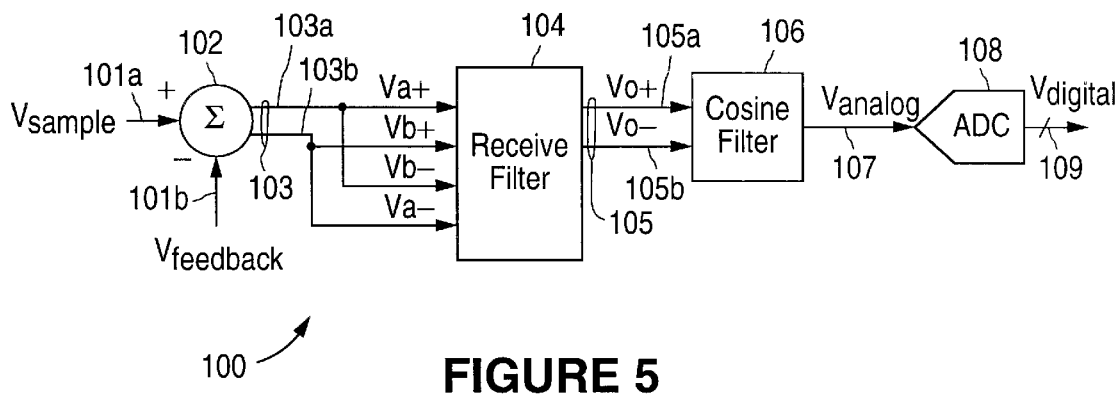
FIG. 5 is a functional block diagram of a signal filter circuit in accordance with one embodiment of the present invention.

Referring to FIG. 5, a switched capacitor filter circuit 100 implemented in accordance with one embodiment of the present invention includes a signal summing circuit 102, a receive filter circuit (with gain) 104, a cosine filter circuit 106 and an ADC circuit 108. The sampled data signal 101a is received and differentially summed with a feedback signal 101b by subtracting the feedback signal 101b from the data signal 101a. A differential summation signal 103 is provided with noninverse 103a and inverse 103b signal phases. These signals 103a, 103b are amplified and filtered by the receive filter stage 104 to produce a differential output voltage 105 with noninverse 105a and inverse 105b signal phases. The cosine filter stage 106 filters the signals 105a, 105b and produces a filtered analog signal 107 which is then converted to a digital signal 109 by the ADC 108. (The receive filter 104 and cosine filter 106 stages are discussed in more detail below.)

Figure 6:
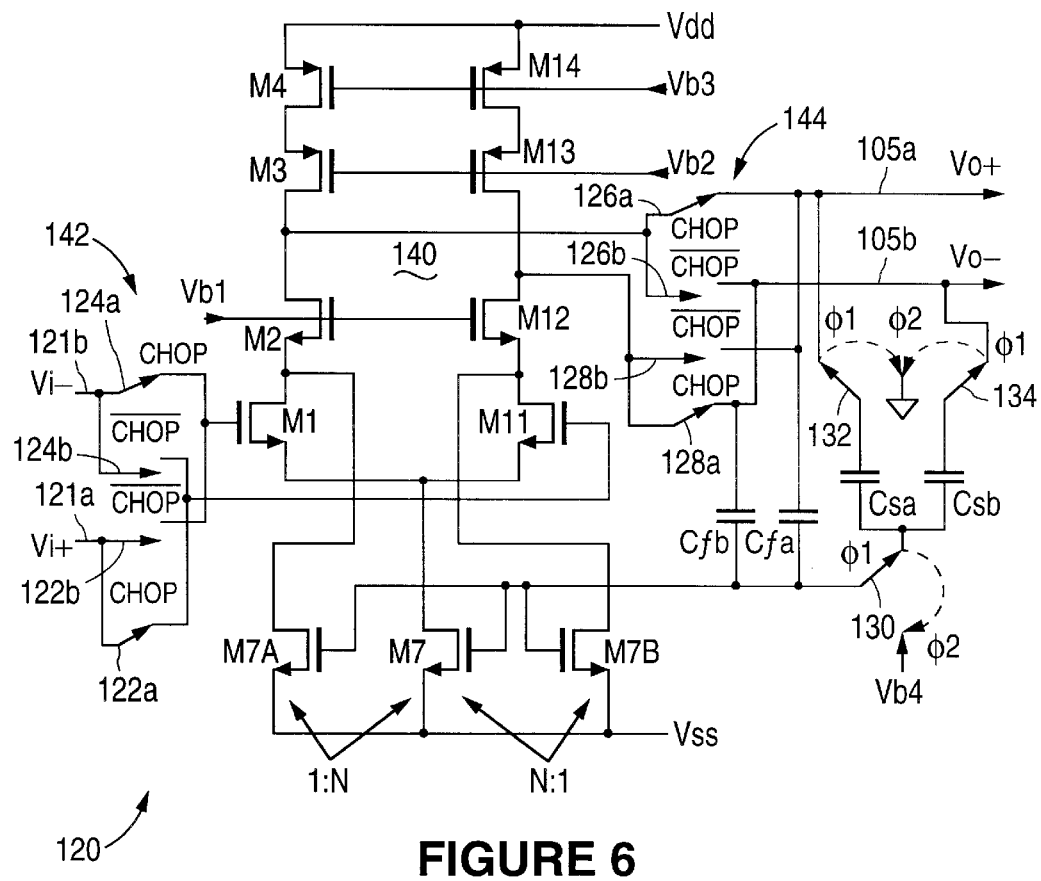
FIG. 6 is a schematic diagram of a chopper-stabilized telescopic differential amplifier circuit suitable for use with the present invention.

Referring to FIG. 6, the receive filter stage 104 includes a chopper-stabilized telescopic differential amplifier circuit 120. Among known fully differential operational amplifier designs, so-called telescopic, or unfolded cascode, amplifiers are known to have a high bandwidth-to-power ratio, albeit at the cost of a somewhat more complicated biasing requirement due to the smaller common mode signal range at the input as compared to the output. However, the reduced common mode input signal range does not present a significant problem for switched capacitor integrators, and any disadvantages of the more complex bias circuitry are generally offset by the reduced power dissipation of the telescopic amplifier design.

Chopper stabilization is achieved by providing switches at both the input and output terminals of the amplifier 120. These switches act as multiplexors to alternate which branch of the differential amplifier is connected to the inverting and noninverting input and output terminals.

The actual differential amplifier 140 includes two circuit branches: PMOS transistors M3 and M4 and NMOS transistors M1 and M2 form one branch; PMOS transistors M13 and M14 and NMOS transistors M11 and M12 form the second branch. Both circuit branches are biased by NMOS transistors M7, M7A and M7B. Transistor M7 is sized to be N-times larger than each of transistors M7A and M7B. Transistor M7 provides biasing for both branches of the differential amplifier 140, while transistor M7A provides a trickle bias for transistors M2, M3 and M4 when transistor M1 is turned off, and transistor M7B provides a trickle bias for transistors M12, M13 and M14 when transistor M11 is turned off. This improves the signal settling characteristics of the differential amplifier 140 in at least two ways.

First, the drain currents of transistors M7A and M7B maintain a bias for signal path cascode transistors M2 and M12, respectively, even when their respective input transistors M1 and M11 are turned off during slewing. This minimizes recovery time problems that may otherwise occur if the cascode transistors M2, M12 were allowed to be turned off completely. Second, common mode feedback is provided through transistors M7A and M7B even when the input transistors M1 and M11, respectively, are turned off during slewing. If common mode feedback were only available to one side of the amplifier at one time, it would result in a differential signal error that would increase the amplifier settling time. (Additional description of this trickle biasing technique and advantages it provides can be found in commonly owned, co-pending U.S. patent application Ser.

No. 08/772,011, entitled "High Speed Fully Differential Operational Amplifier With Fast Settling Time for Switched Capacitor Applications," the disclosure of which is incorporated herein by reference.)

A set 142 of input signal switches 122a, 122b, 124a, 124b is connected between the noninverting 121a and inverting 121b input terminals and the gate terminals of transistors M1 and M11. A set 144 of output signal switches 126a, 126b, 128a, 128b is connected between the drain terminals of transistors M2 and M12 and the noninverting 105a and inverting 105b output terminals. During the time period that the chop signal CHOP is asserted (and $\overline{CHOP}$ is not asserted), the noninverting 121a and inverting 121b input terminals are connected to the gate terminals of transistors M11 and M1, respectively, and the noninverting 105a and inverting 105b output terminals are connected to the drain terminals of transistors M2 and M12, respectively. Conversely, during the time period that signal $\overline{CHOP}$ is asserted (and signal CHOP is not asserted) the noninverting 121a and inverting 121b input terminals are connected to the gate terminals of transistors M1 and M11, respectively, and the noninverting 105a and inverting 105b output terminals are connected to the drain terminals of transistors M12 and M2, respectively.

Figure 7:
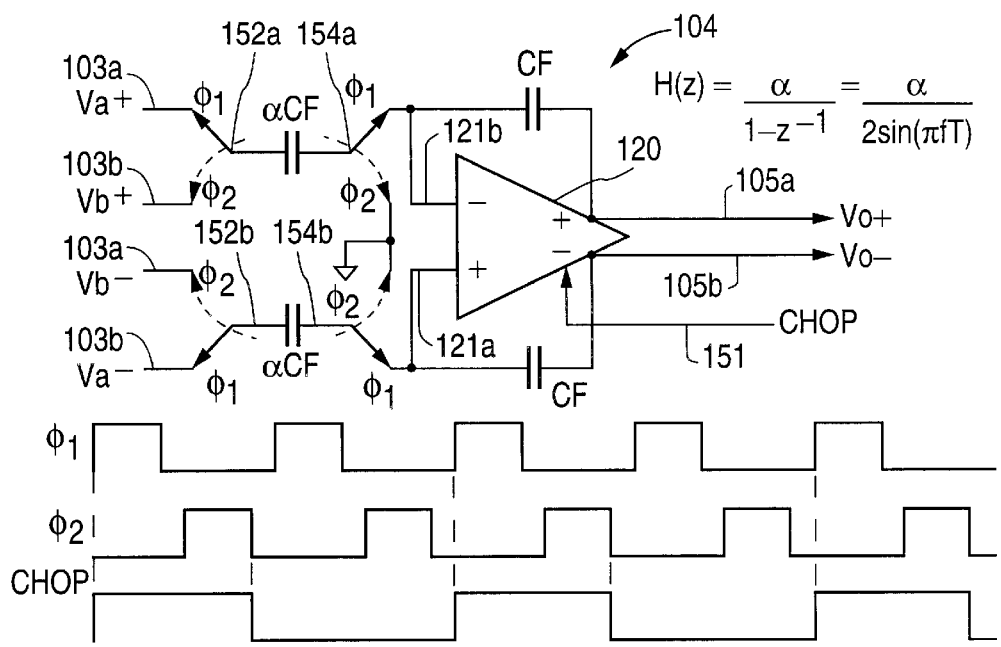
FIG. 7 is a schematic diagram and associated signal timing diagram for a switched capacitor integrator circuit in which the amplifier circuit of FIG. 6 is suitable for use.
Figure 8A:
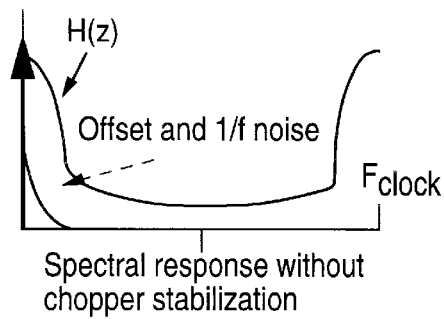
FIG. 8 is a series of spectral response diagrams for the circuit of FIG. 7 when used with a cosine filter stage.
Figure 8B:
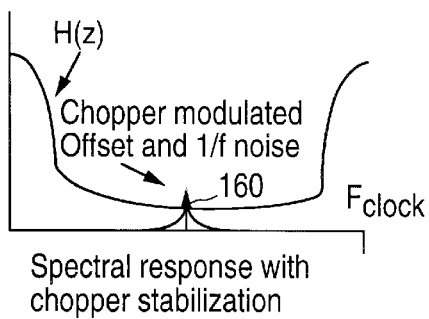
Figure 8C:
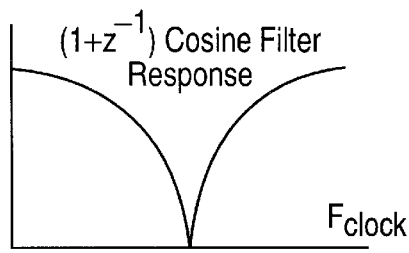
Figure 8D:
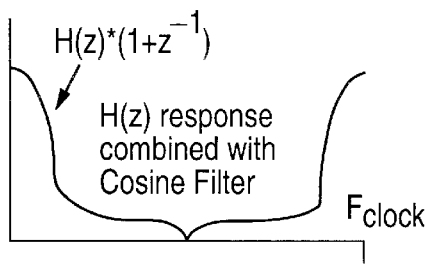

During the initial portions of the asserted states of signals CHOP and $\overline{CHOP}$, another signal $\phi 1$ is asserted, while during the last portions of signals CHOP and $\overline{CHOP}$, yet another control signal $\phi 2$ is asserted. The asserted signal states of these control signals $\phi 1$, $\phi 2$ are mutually exclusive in time and nonoverlapping. (These signals are illustrated in FIG. 7.) Accordingly, during the initial portions of the CHOP and $\overline{CHOP}$ signals, common mode capacitive feedback between the output terminals 105a, 105b and the biasing transistors M7, M7A, M7B is provided by capacitors Cfa and Csa and capacitors Cfb and Csb. During the last portions of the CHOP and $\overline{CHOP}$ signals, capacitors Csa and Csb are discharged and capacitors Cfa and Cfb are precharged by a bias voltage Vb4. (Bias voltages Vb1, Vb2, Vb3 and Vb4 can be generated using conventional replica bias circuit techniques, such as diode-connected transistors driven by current sources.)

Therefore, as the amplifier circuit 120 changes from the CHOP state to the $\overline{CHOP}$ state, the compensation capacitors Cfa, Cfb, Csa, Csb are effectively disconnected from the output terminals 105a, 105b. Hence, the slewing of the circuit 120 becomes very fast and is limited substantially only by the parasitic capacitances present at the drain terminals of output transistors M2 and M12. Accordingly, due to such fast slewing, the chopped amplifier circuit 120 exhibits virtually no residual memory of the preceding CHOP clock state.

Referring to FIG. 7, one embodiment of the receive filter circuit 104 (FIG. 5) can be implemented as a switched capacitor integrator circuit using a chopper-stabilized telescopic differential amplifier circuit 120 (FIG. 6) with feedback capacitors CF and switched input capacitors $\alpha$CF. This circuit 104 is switched using a clock signal with two nonoverlapping phases $\phi 1$, $\phi 2$ which, as discussed above, are also used in the differential amplifier circuit 120. This switched capacitor technique reduces signal-dependent charge injection effects.

During clock phase $\phi 1$, the noninverse 103a and inverse 103b phases of the summation signal 103 (FIG. 5) are capacitively coupled through the input capacitors $\alpha$CF to the inverting 121b and noninverting 121a terminals, respectively, of the differential amplifier circuit 120. During clock signal phase $\phi 2$, the noninverse 103a and inverse 103b signals are capacitively coupled to circuit ground.

Referring to FIG. 8, the effects of this switched-capacitor integration is represented. As shown in graphs (A) and (B), as a result of the chopper stabilization of the switched capacitor integrator circuit 104, the DC offset, as well as the 1/f noise, of the operational amplifier 120 is modulated up to the frequency of the chopping signal CHOP. Qualitatively, this chopper stabilization causes the offset of the operational amplifier 120 to appear as a square wave at the output terminals 105a, 105b of the amplifier 120. This square wave has an amplitude which is proportional to the product of the original, i.e., non-chopped, operational amplifier offset and the switched-capacitor filter magnitude response at the fundamental frequency of the chopping signal CHOP. The frequency of this square wave is equal to the frequency of the chopping signal CHOP. Accordingly, notwithstanding the reduced magnitude of this signal component 160 due to the filtering action of the switched-capacitor integrator circuit 104, such signal component 160 can still cause problems later in this system if left unfiltered.

Referring to graphs (C) and (D), one way to eliminate this unwanted signal component 160 is to use a cosine filter circuit with a sampling rate which is synchronized to the chopper stabilization signal CHOP. Doing so will cause this signal component 160 to be "notched" out due to the narrow bandstop filter characteristics of the cosine filter response. This filtering action can be represented by Equation (2).

$$\left| \frac{(1+z^{-1})}{2} \right| = \cos\left( \frac{\pi \cdot f_{signal}}{F_{clock}} \right) \equiv 0 \text{ if } f_{signal} = \frac{F_{signal}}{2} \quad (2)$$

Since the frequency of the chopping signal CHOP is set equal to one-half of the clock frequency ($F_{clock}/2$), the spurious filter output due to the modulated DC offset (and 1/f noise) will be nulled out if the filter is convolved with $(1+z^{-1})$.

Figure 9:
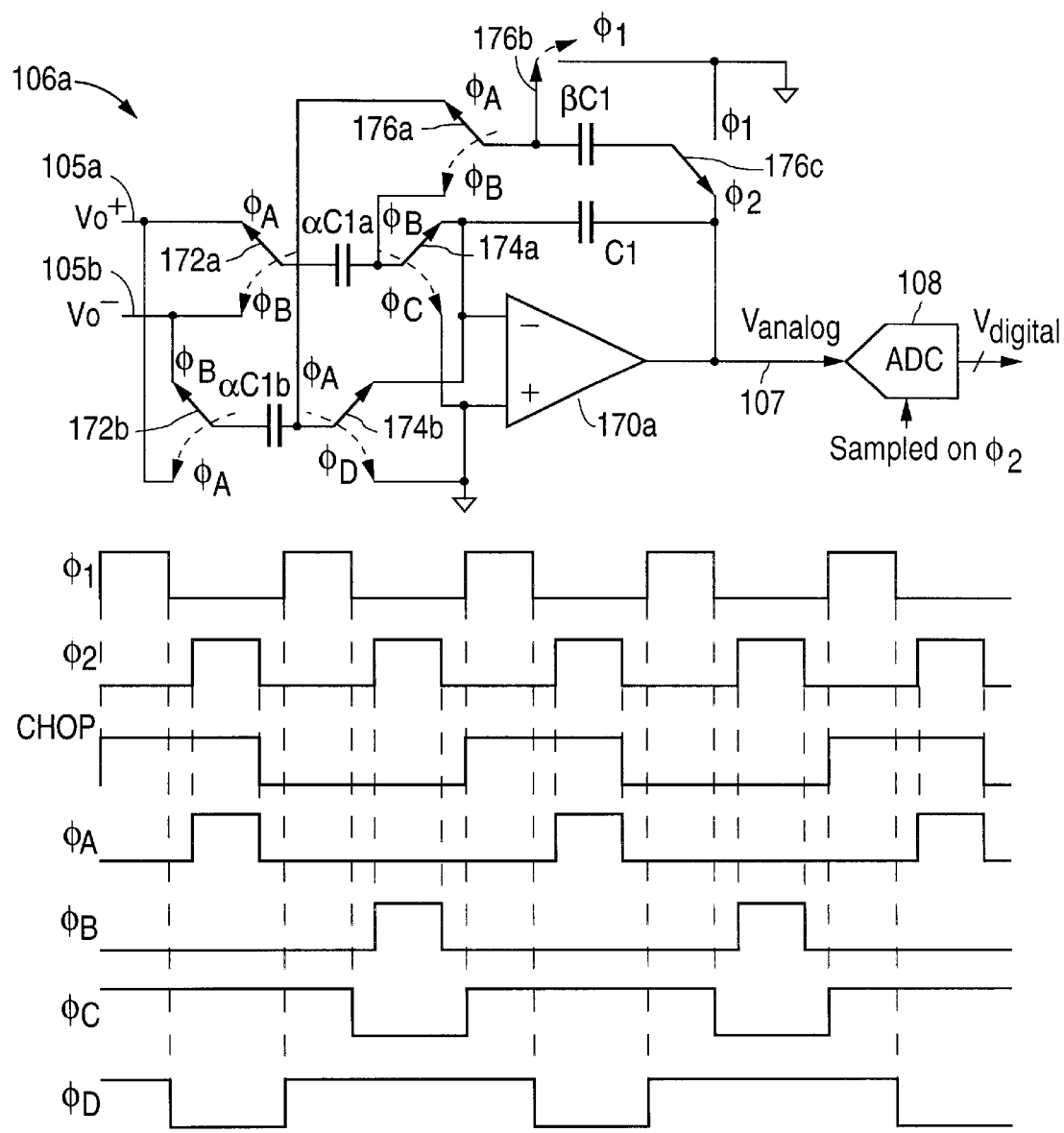
FIG. 9 is a schematic diagram and associated signal timing diagram for a switched-capacitor cosine filter circuit suitable for use with the circuit of FIG. 7 in accordance with one embodiment of the present invention.

Referring to FIG. 9, one embodiment 106a of the cosine filter circuit 106 (FIG. 5) can be implemented as shown. Four additional switch control signals $\phi A$, $\phi B$, $\phi C$, $\phi D$ are used, along with the original CHOP signal and clock signals $\phi 1$ and $\phi 2$. The operational amplifier 170a has a grounded noninverting input terminal and an inverting input terminal which is coupled to its output terminal by a feedback capacitor C1. An additional feedback capacitor $\beta$C1 and input capacitors $\alpha$C1a, $\alpha$C1b are switched using switches 172a, 172b, 174a, 174b, 176a, 176b, 176c in accordance with the control signals $\phi 1$, $\phi 2$, $\phi A$, $\phi B$, $\phi C$, $\phi D$. For example, when signals $\phi 2$, $\phi A$ and $\phi C$ are asserted (i.e., at a logic high), the noninverse input signal Vo+ (at terminal 105a) is capacitively coupled to circuit ground with capacitor C1a and to the inverting input terminal of the operational amplifier 170a with capacitor $\alpha$C1b and feedback capacitors C1, $\beta$C1 are connected in parallel. (During assertion of signal $\phi 1$, feedback capacitor $\beta$C1 is discharged.)

With the switched-capacitor integrator circuit 104 of FIG. 7 providing the input signals 105a, 105b for the switched-capacitor cosine filter circuit 106a of FIG. 9, the overall transfer function is defined by Equation (3).

$$H(z^{-1}) = \frac{2 \cdot \alpha (1 + z^{-1})}{(1 + \beta) - z^{-1}} \text{ if } \alpha C1a = \alpha C1b \equiv \alpha C1 \quad (3)$$

The operation of the switched-capacitor cosine filter circuit 106a of FIG. 9 can be explained as follows. For purposes of this discussion, it is assumed that the offset of the preceding stage, i.e., the switched-capacitor integrator circuit 104 of FIG. 7, is positive with respect to the output common mode voltage of such circuit 104 during the relevant clock signal phase (φA, φB, φC, φD).

During clock phase φA, input capacitor αC1a is used to sample the noninverting input signal Vo+ as noninverting integrator. Subsequently, during clock phase φB, capacitor αC1a is used to sample the inverting input signal Vo− as an inverting integrator. It should be understood that during clock phase φB the chopper clock signal CHOP has switched states and the offset of the integrator circuit 104 has now become negative. Therefore, the offset sampled during clock phase φB by capacitor αC1a at the inverting output terminal 105b will be positive with respect to the output common mode voltage of the preceding stage 104.

Based upon the foregoing, an important sequence of events should be evident. Input capacitor αC1a is used to sample the noninverse signal Vo+ as a noninverting integrator and sample the inverse signal Vo− (delayed by one clock cycle) as an inverting integrator, plus capacitor αC1a receives the positive offset value during both sampling signal phases. Accordingly, the offset voltage received by capacitor αC1a is the same during both clock signal phases and, therefore, does not cause a charge transfer event for capacitor αC1a.

Similarly, capacitor αC1b is used to sample the noninverse signal Vo+ as a noninverting integrator and sample the inverse signal Vo− (delayed by one clock cycle) as an inverting integrator, plus capacitor αC1b receives the negative offset voltage during both sampling signal phases. Accordingly, the offset voltage received by capacitor αC1b is the same during both clock signal phases and, therefore, does not cause a charge transfer event for capacitor αC1b.

One advantage of this circuit implementation is that cancellation of the DC offset voltage from the preceding stage 104 does not depend upon the matching between capacitors αC1a and αC1b. Rather, cancellation of the offset depends upon the error, if any, of the RC switch time constant at the end of the clock signal phases.

Any remaining residual error is then due to the offset from the operational amplifier 170a within the cosine filter circuit 106a. Any such error is amplified by the ratio of the capacitors (αC1/βC1+1). For example, with five millivolts (mV) of offset in the operational amplifier 170a, this residual error is less than ¼ of an LSB. It should also be understood that since the duty cycles of clock signals φA and φB are each 25 percent, this circuit 106a can also be used, without modification, if the switched-capacitor integrator circuit 104 of FIG. 7 is reconfigured as a "double-sampled" integrator circuit.

Based on the foregoing, it should be understood that using chopper stabilization combined with a switched-capacitor cosine filter significantly improves offset of the overall filter circuit, even if no further correction techniques are applied. With reduced offsets, less time is required by the system to settle, thereby reducing the overhead time needed for a system to acquire offset when powering up. Additionally, the use of the cosine filter prevents any spurious frequency components from being introduced into the filter output spectrum that might degrade overall receiver performance.

Figure 9A:
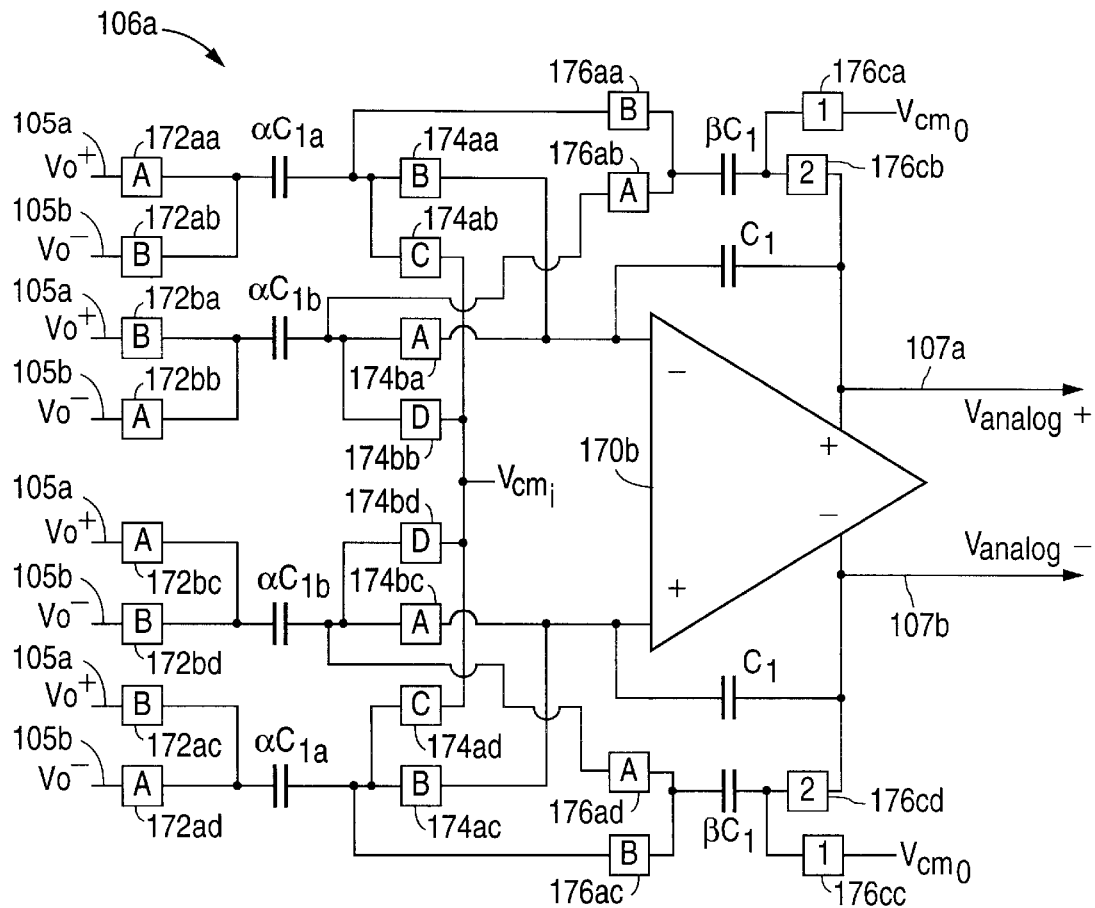
FIG. 9A is a schematic diagram for a fully differential switched-capacitor cosine filter circuit in accordance with another embodiment of the present invention.

Referring to FIG. 9A, another embodiment 106b of the cosine filter circuit 106 (FIG. 5) can be implemented as shown. Unlike the embodiment 106a of FIG. 9 in which a single-ended output signal 107 is provided, this implementation is fully differential and provides a differential output signal 107a/107b. This circuit 106b includes an operational amplifier 170b with a differential output and uses the same input capacitors αC1a, αC1b, feedback capacitors C1, βC1, switch control signals φA, φB, φC, φD, CHOP signal and clock signals φ1, φ2 (per timing diagram portion of FIG. 9). A portion of the switched-capacitor input circuit is connected to an input common mode bias potential Vcmi (e.g., circuit ground) and portions of the switched-capacitor feedback circuit are connected to an output common mode bias potential Vcmo (e.g., circuit ground). The switching elements (e.g., pass transistors, transmission gates or other well known switching circuits) are represented in the form of boxes with the designators "1," "2," "A," "B," "C" and "D" and function as switches which are closed during the assertion, or logical high state, of signals φ1, φ2, φA, φB, φC, φD, respectively, and open otherwise. Hence, just as the circuit 106a of FIG. 9, this circuit 106b samples the inverse 105b and noninverse 105a differential input signal phases as a noninverting integrator circuit during one state of such signals φ1, φ2, φA, φB, φC, φD, and as an inverting integrator circuit during another state of such signals φ1, φ2, φA, φB, φC, φD.

Figure 1:
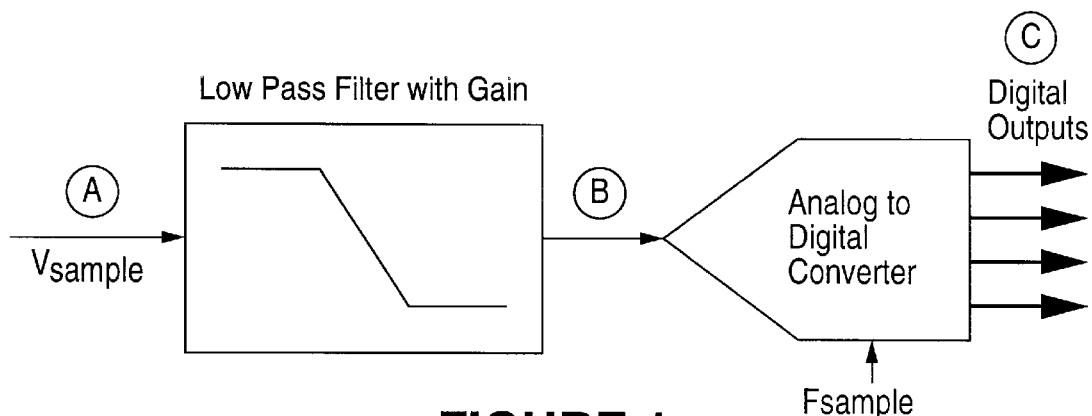
FIG. 1 is a functional block diagram of a conventional digital communication system receive signal path with low pass filtering and analog-to-digital conversion.
Figure 2:
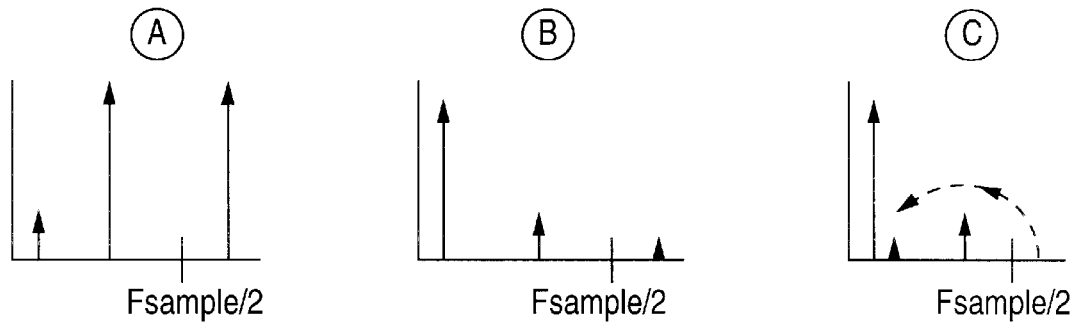
FIG. 2 is a series of signal spectrum representations illustrating signal aliasing for the circuit of FIG. 1.
Figure 3:
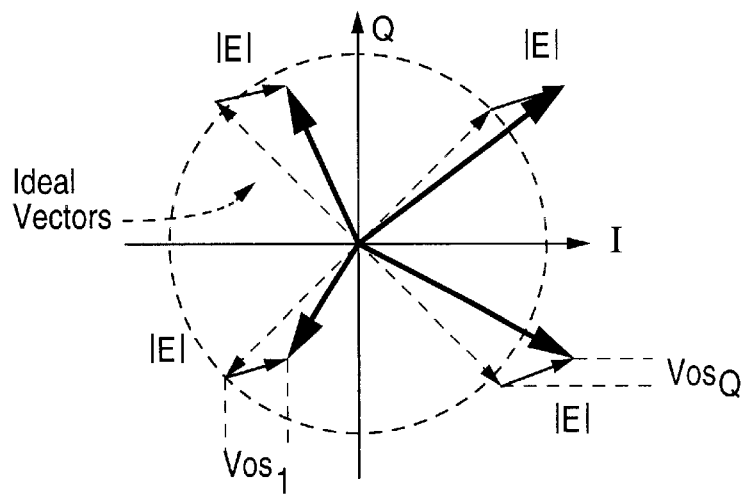
FIG. 3 is a QPSK constellation diagram showing offset errors for the circuit of FIG. 1.
Figure 4:
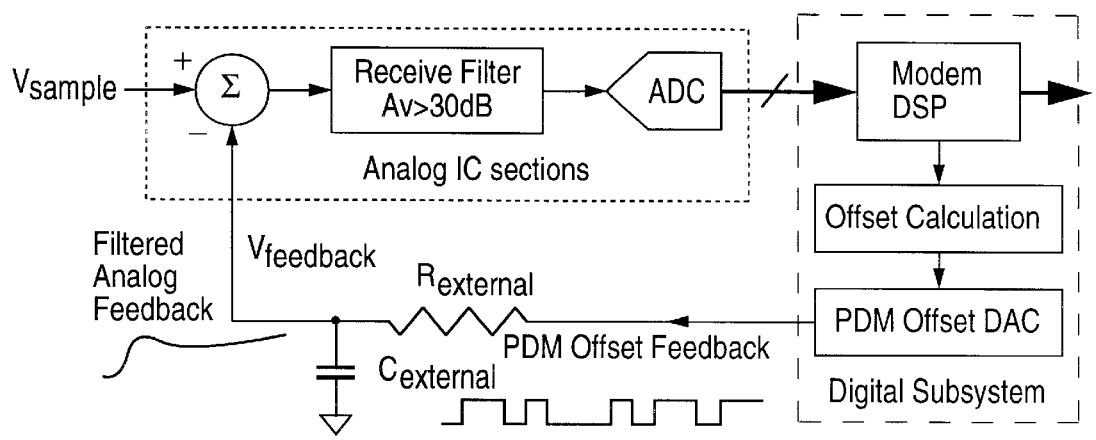
FIG. 4 is a functional block diagram of a conventional offset compensation loop for use with the circuit of FIG. 1.
Figure 10:
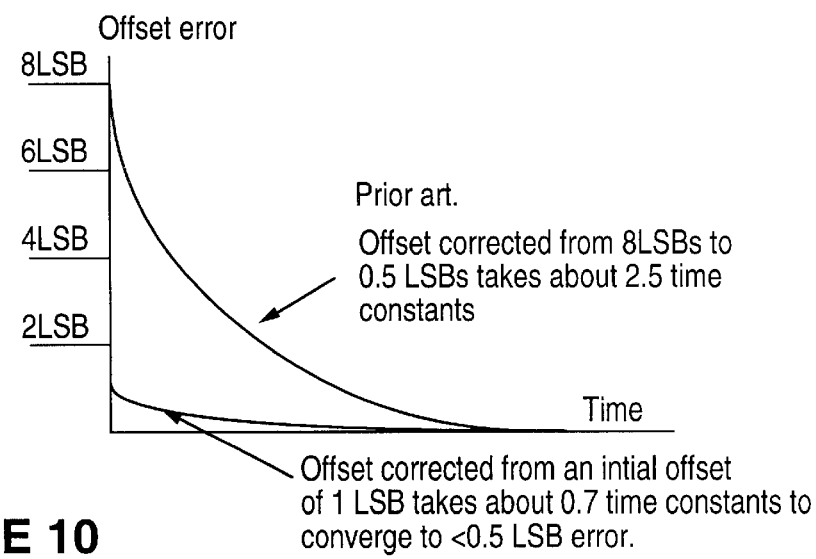
FIG. 10 illustrates the difference in convergence time between a conventional compensation feedback loop and one embodiment of a compensation feedback loop using the present invention.

Referring to FIG. 10, with a chopper-stabilized operational amplifier, the switched-capacitor filter output offset is reduced to within +/−1 LSB with a relatively fast time constant set by the receive filter bandwidth (e.g., 630 kHz). This "coarse" offset correction provided by the chopper stabilization occurs within less than 10 microseconds. (With one conventional receive filter circuit, the initial offset can be equal to or greater than eight LSBs.) When such a chopper-stabilized filter circuit is combined with a cosine filter circuit, as discussed above, the offset compensation occurs in approximately 0.5 time constants as compared to 2.5 time constants with the conventional circuit. (The time constant of the external RC filter network (FIG. 4) is fixed in accordance with the bandwidth of the subject baseband signal.)

Figure 11:
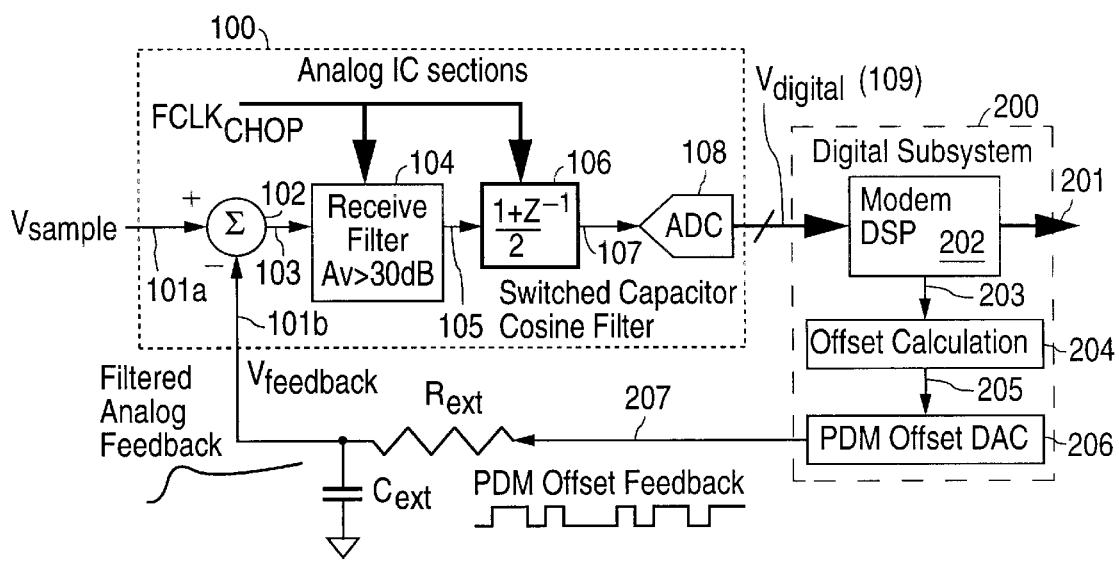
FIG. 11 is a functional block diagram of an offset compensation technique for a digital communications receiver in accordance with one embodiment of the present invention.

Referring to FIG. 11, the switched capacitor filter circuit having reduced offsets and providing offset compensation when used in a closed feedback loop includes the switched capacitor filter circuit 100 (FIG. 5) connected in a feedback loop with a digital subsystem 200. The subsystem 200 includes a digital signal processor (DSP) 202, such as that used in a MODEM, which processes the digital output signal 109 to produce a processed digital signal 201. The DSP 202 also produces a digital feedback signal 203 from which an offset calculation circuit 204 determines the magnitude of any offset present in the input digital signal 109. A signal 205 representing the calculated offset is used to produce a PDM signal with a digital-to-analog convertor (DAC) 206. The resulting analog PDM signal is filtered with a low pass filter circuit to produce the feedback signal 101b for the signal summation circuit 102. As discussed above, the circuit settles significantly faster than conventional designs due to the significantly reduced offsets produced by the filter circuit 100.

Figure 12:
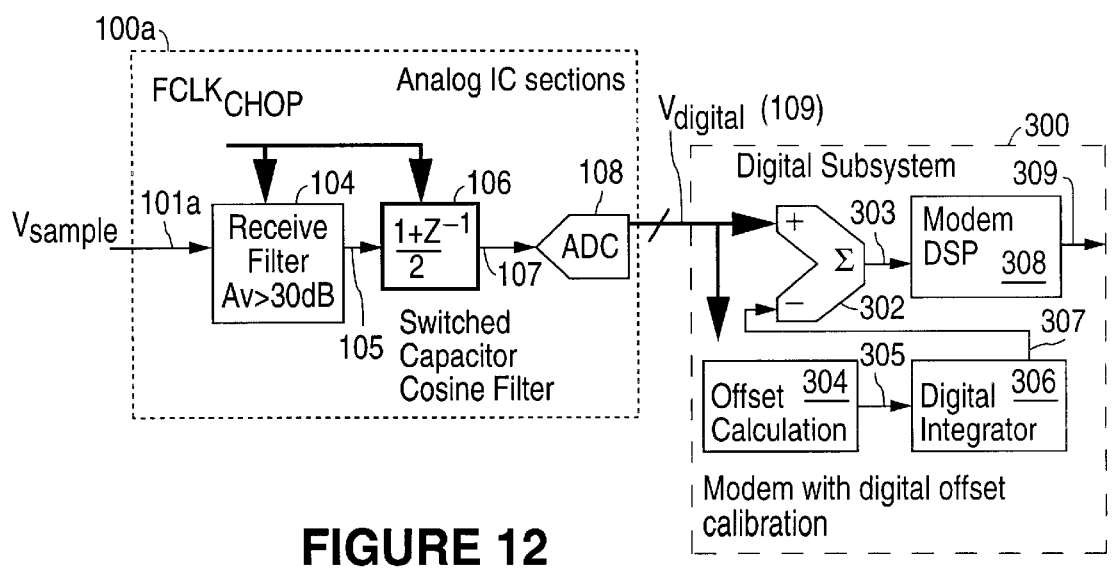
FIG. 12 is a functional block diagram of an offset compensation technique for a digital communications receiver using the present invention.

Referring to FIG. 12, with the offset produced by the filter circuit 100 being significantly reduced, as compared to the conventional designs, a modified filter circuit 100a can be used in which the signal summation circuit 102 is omitted since no feedback signal 101b is required. Instead, the digital subsystem 300 can compensate for any offsets while operating strictly in a digital domain.

In this embodiment, an offset calculation circuit 304 within the digital subsystem 300 computes the amount of offset contained within the digital input signal 109 from the filter circuit 100a. A signal 305 representing this computed offset is integrated using a digital integrator circuit 306. The resulting digital integrated signal 307 is differentially added with the original digital signal 109 in an adder circuit 302. The resulting sum signal 303 is then processed by a DSP 308 to produce a processed signal 309 as desired.

The digital integrator 306 can be implemented with a counter and implements a low pass filter type of function. For example, if the "unity gain" frequency of the digital integrator 306 is set equal to the inverse of the product of the external resistance Rext and capacitance Cext of the low pass feedback filter in the circuit of FIG. 11, the dynamic performance of the loop in the circuit of FIG. 12 will be equivalent to the dynamic performance of the circuit of FIG. 11. This all-digital implementation of an offset compensation loop has the further advantage of a "perfect memory" between power-up cycles of the system, such as those which occur during alternating active and standby modes of operation.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a switched capacitor filter circuit having reduced offsets and providing offset compensation when used in a closed feedback loop, comprising:
   a signal combining circuit configured to receive and combine an input data signal and an offset compensation signal and in accordance therewith provide a compensated data signal;
   a chopper stabilized amplified filter circuit, coupled to said signal combining circuit, configured to receive one or more chop control signals and in accordance therewith receive and low pass filter said compensated data signal and in accordance therewith provide a low pass filtered signal with an out of band signal frequency component which is at a frequency of said one or more chop control signals and represents an offset and 1/f noise of said chopper stabilized amplified filter circuit;
   an output filter circuit, coupled to said chopper stabilized amplified filter circuit, configured to receive and filter said low pass filtered signal and in accordance therewith provide a filtered output data signal in which said out of band signal frequency component is substantially reduced in magnitude; and
   an analog-to-digital conversion (ADC) circuit, coupled to said output filter circuit, configured to receive and convert said filtered output data signal and in accordance therewith provide a digital output signal;
wherein said offset compensation signal corresponds to a residual offset within said digital output signal resulting from said providing of said low pass filtered signal and said filtered output data signal by said chopper stabilized amplified filter circuit and said output filter circuit, respectively.

2. The apparatus of claim 1, wherein said signal combining circuit comprises a signal summing circuit.

3. The apparatus of claim 1, wherein said chopper stabilized amplified filter circuit comprises a switched capacitor integrator circuit which includes a chopper stabilized amplifier circuit.

4. The apparatus of claim 1, wherein:
   said chopper stabilized amplified filter circuit includes
      a switched capacitor circuit configured to receive a plurality of switch control signals, and
      a chopper stabilized amplifier circuit, coupled to said switched capacitor circuit, configured to receive said one or more chop control signals and provide said low pass filtered signal; and
   said switched capacitor circuit and said chopper stabilized amplifier circuit are operatively coupled together and configured to receive and low pass filter said compensated data signal and in accordance therewith provide said low pass filtered signal.

5. The apparatus of claim 4, wherein said chopper stabilized amplifier circuit comprises:
   an input switching circuit configured to receive said one or more chop control signals and in accordance therewith receive and convey an input signal with a first plurality of alternating signal polarities;
   a telescopic amplifier circuit, coupled to said input switching circuit, configured to receive and amplify said input signal and in accordance therewith provide an output signal; and
   an output switching circuit, coupled to said telescopic amplifier circuit, configured to receive said one or more chop control signals and in accordance therewith receive and convey said output signal with a second plurality of alternating signal polarities.

6. The apparatus of claim 5, further comprising a capacitive feedback circuit, coupled between said output switching circuit and said telescopic amplifier circuit, configured to receive said plurality of switch control signals and in accordance therewith capacitively couple said low pass filtered signal to a portion of said telescopic amplifier circuit.

7. The apparatus of claim 1, wherein said output filter circuit comprises a switched capacitor cosine filter circuit.

8. The apparatus of claim 7, wherein:
   said switched capacitor cosine filter circuit includes
      a switched capacitor circuit configured to receive a plurality of switch control signals, and
      an amplifier circuit coupled to said switched capacitor circuit;
   said switched capacitor circuit and said amplifier circuit are operatively coupled together and configured to receive and filter said low pass filtered signal and in accordance therewith provide said filtered output data signal; and
   said plurality of switch control signals is synchronized with said one or more chop control signals.

9. The apparatus of claim 1, further comprising:
   a digital modem circuit, coupled to said switched capacitor filter circuit, configured to receive and process said digital output signal and in accordance therewith provide a feedback signal; and
   a feedback filter circuit, coupled to said digital modem circuit and said switched capacitor filter circuit, configured to receive and low pass filter said feedback signal and in accordance therewith provide said offset compensation signal.

10. The apparatus of claim 9, wherein said digital modem circuit comprises:
   a digital signal processing circuit configured to receive and process said digital output signal and in accordance therewith provide a plurality of processed signals including an offset error signal; and a pulse density modulator circuit, coupled to said digital signal processing circuit, configured to receive said offset error signal and in accordance therewith provide a pulse density modulated signal as said feedback signal.

11. A method which includes switching a plurality of capacitors to filter a signal with reduced offsets and providing offset compensation when filtering said signal in a closed feedback loop, comprising the steps of:

receiving and combining an input data signal and an offset compensation signal and in accordance therewith generating a compensated data signal;

receiving one or more chop control signals and in accordance therewith low pass filtering said compensated data signal and in accordance therewith generating a low pass filtered signal with an out of band signal frequency component which is at a frequency of said one or more chop control signals and represents an offset and 1/f noise;

filtering said low pass filtered signal and in accordance therewith generating a filtered output data signal in which said out of band signal frequency component is substantially reduced in magnitude; and converting said filtered output data signal and in accordance therewith generating a digital output signal;

wherein said offset compensation signal corresponds to a residual offset within said digital output signal resulting from said generating of said low pass filtered signal and said filtered output data signal.

12. The method of claim 11, wherein said step of receiving and combining an input data signal and an offset compensation signal and in accordance therewith generating a compensated data signal comprises the step of summing said input data signal and said offset compensation signal.

13. The method of claim 11, wherein said step of receiving one or more chop control signals and in accordance therewith low pass filtering said compensated data signal and in accordance therewith generating a low pass filtered signal comprises the steps of:

switching one or more capacitors and in accordance therewith integrating said compensated data signal; and chopper stabilizing an amplifier circuit in accordance with said one or more chop control signals during said integrating of said compensated data signal.

14. The method of claim 11, wherein said step of receiving one or more chop control signals and in accordance therewith low pass filtering said compensated data signal and in accordance therewith generating a low pass filtered signal comprises the steps of:

receiving a plurality of switch control signals and in accordance therewith switching one or more capacitors;

chopper stabilizing an amplifier circuit in accordance with said one or more chop control signals; and integrating said compensated data signal and in accordance therewith generating said low pass filtered signal.

15. The method of claim 14, wherein said step of receiving one or more chop control signals and in accordance therewith low pass filtering said compensated data signal and in accordance therewith generating a low pass filtered signal comprises the steps of:

receiving said one or more chop control signals and in accordance therewith receiving and conveying an input signal with a first plurality of alternating signal polarities;

receiving and telescopically amplifying said input signal and in accordance therewith generating an output signal; and receiving said one or more chop control signals and in accordance therewith receiving and conveying said output signal with a second plurality of alternating signal polarities.

16. The method of claim 15, further comprising the step of receiving said plurality of switch control signals and in accordance therewith capacitively feeding back said low pass filtered signal during said telescopically amplifying of said input signal.

17. The method of claim 11, wherein said step of filtering said low pass filtered signal and in accordance therewith generating a filtered output data signal in which said out of band signal frequency component is substantially reduced in magnitude comprises the step of cosine filtering said low pass filtered signal with one or more switched capacitors.

18. The method of claim 17, wherein said step of cosine filtering said low pass filtered signal with one or more switched capacitors comprises the steps of:

receiving a plurality of switch control signals synchronized with said one or more chop control signals and in accordance therewith switching one or more capacitors and in accordance therewith generating a switched signal; and amplifying said switched signal and in accordance therewith provide said filtered output data signal.

19. The method of claim 11, further comprising the steps of:

processing said digital output signal with a digital modem circuit and in accordance therewith generating a feedback signal; and low pass filtering said feedback signal and in accordance therewith generating said offset compensation signal.

20. The method of claim 19, wherein said step of processing said digital output signal with a digital modem circuit and in accordance therewith generating a feedback signal comprises the steps of:

digitally processing said digital output signal and in accordance therewith generating a plurality of processed signals including an offset error signal; and receiving said offset error signal and in accordance therewith generating a pulse density modulated signal as said feedback signal.

* * * * *